(12) United States Patent
Wang et al.

(10) Patent No.: US 10,243,015 B1
(45) Date of Patent: Mar. 26, 2019

(54) SILICON PHOTOSENSOR ARRAY INTEGRATED CIRCUIT ON [110]SUBSTRATE WITH DEEP, ANISOTROPICALLY-ETCHED, TRENCH ISOLATION

(71) Applicant: OmniVision Technologies, Inc., Santa Clara, CA (US)

(72) Inventors: Xin Wang, Foothill, CA (US); Dajiang Yang, San Jose, CA (US); Siguang Ma, Mountain View, CA (US); Duli Mao, Sunnyvale, CA (US); Dyson H. Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/872,887

(22) Filed: Jan. 16, 2018

(51) Int. Cl.
*H01L 27/146* (2006.01)
*H04N 5/378* (2011.01)
*H04N 5/374* (2011.01)

(52) U.S. Cl.
CPC .... *H01L 27/1463* (2013.01); *H01L 27/14643* (2013.01); *H01L 27/14687* (2013.01); *H01L 27/14689* (2013.01); *H04N 5/374* (2013.01); *H04N 5/378* (2013.01)

(58) Field of Classification Search
None
See application file for complete search history.

(56) References Cited

U.S. PATENT DOCUMENTS

| 2003/0012925 A1* | 1/2003 | Gorrell | H01L 21/30608 428/137 |
| 2014/0131722 A1* | 5/2014 | Bayram | H01L 29/04 257/76 |
| 2015/0243546 A1 | 8/2015 | Meade et al. | |

OTHER PUBLICATIONS

Sato (2015) "Basic 2 Anisotropic Wet-etching of Silicon: Characterization and Modeling of Changeable Anisotropy." Characterization and Modeling of Changeable Anisotropy COE for Education and Research of Micro-Nano Mechatronics, Dept. of Micro/Nano Systems Engineering, Nagoya University, 53 pp.
Yardley (2001) "Silicon Basics—General Overview." Powerpoint Presentation, 39 pages.

\* cited by examiner

*Primary Examiner* — Fernando L Toledo
*Assistant Examiner* — Lawrence-Lin T Nguyen
(74) *Attorney, Agent, or Firm* — Lathrop Gage LLP

(57) ABSTRACT

A method for fabricating a photosensor array integrated circuit includes forming an isolation trench by a method comprising depositing a hard mask layer on a [110]-oriented single-crystal silicon substrate wafer, depositing, exposing, and developing a photoresist on the hard mask layer to define photoresist openings of locations for the trenches, dry plasma etching through the photoresist openings to form openings in the hard mask layer of locations for the trenches, and performing an anisotropic wet etch through the openings in the hard mask layer. In particular embodiments, the trenches are lined with P-type silicon, a silicon dioxide dielectric, and an additional oxide layer before being filled with tungsten.

16 Claims, 5 Drawing Sheets

SILICON PHOTOSENSOR ARRAY INTEGRATED CIRCUIT ON [110]SUBSTRATE WITH DEEP, ANISOTROPICALLY-ETCHED, TRENCH ISOLATION

BACKGROUND

Typical CMOS silicon array photosensors have an array of photosensor cells, each cell including at least one photodiode and at least one transistor. The at least one transistor arranged to select photodiode, reset the photodiode by charging it to a "dark" level, and to sense charge on the photodiode after the photodiode has been exposed to light. There are several different physical and circuit arrangements of the transistors in cells known in the art.

Exposure of the photodiode to light alters charge on the photodiode from the "dark" level to a level that is a function of the amount of light to which the photodiode is exposed. Dark current of a photodiode is a leakage current in each photodiode that also alters charge on the photodiode in similar manner to the way light alters charge on the photodiode.

Most prior silicon array photosensors are built in [100] single-crystal substrates. Some of these photosensors have isolation trenches to limit crosstalk and leakage between adjacent photosensors of the array; crosstalk and leakage may result in blooming of images having intensely lit areas near dark areas. Embodiments disclosed herein pertain to isolation trenches in silicon substrates used with such array photosensors, and fabrication methods thereof.

SUMMARY

In an embodiment, a method for fabricating a photosensor array integrated circuit includes forming an isolation trench by a method comprising depositing a hard mask layer on a [110]-oriented single-crystal silicon substrate wafer, depositing, exposing, and developing a photoresist on the hard mask layer to define photoresist openings of locations for the trenches, dry plasma etching through the photoresist openings to form openings in the hard mask layer of locations for the trenches, and performing an anisotropic wet etch through the openings in the hard mask layer. In particular embodiments, the trenches are lined with P-type silicon, a silicon dioxide dielectric, and an additional oxide layer before being filled with tungsten. In embodiments, the method also includes forming photodiodes and transistors associated with the photodiodes in islands separated by isolation trenches.

In another embodiment, an array photosensor integrated circuit has multiple photosensor cells separated by isolation trenches, where each photosensor cell has a photodiode and at least one transistor. The trenches are lined with a lining of boron-doped silicon, a layer of silicon dioxide adjacent the boron-doped silicon, and a filler of metal. In particular embodiments, the filler is tungsten.

DETAILED DESCRIPTION OF THE EMBODIMENTS

Isolation trenches are typically cut into the silicon surface using a masking step followed by a dry plasma etch. Dry plasma etching is performed by exciting molecules of a gas to form reactive ions, and exposing the surface to be etched to these reactive ions. The reactive ions then eat into the exposed surface, removing surface to produce the trench, and leaving walls of the trench with some damage that contributes to dark current of photodiodes built in silicon adjacent the trench. Exciting molecules of the gas may be done with microwaves, by gas discharge, or in other ways. Since excited gas molecules attack trench sidewalls as well as trench bottom, the trench may be completed with width significantly greater than the width of slots in masking layers used to define the trench.

Some wet-etching processes are known to etch silicon surfaces at rates that vary with the crystallographic orientation of the silicon surface. These are known as "anisotropic" etching processes. In some anisotropic etching processes etching slows or stops when a [111]-oriented surface is reached. FIG. 1 depicts a deep-trench isolated silicon photosensor array 100 that may be formed by a processing method 200 of FIG. 2, which includes a step of wet-etching.

Figure 2:
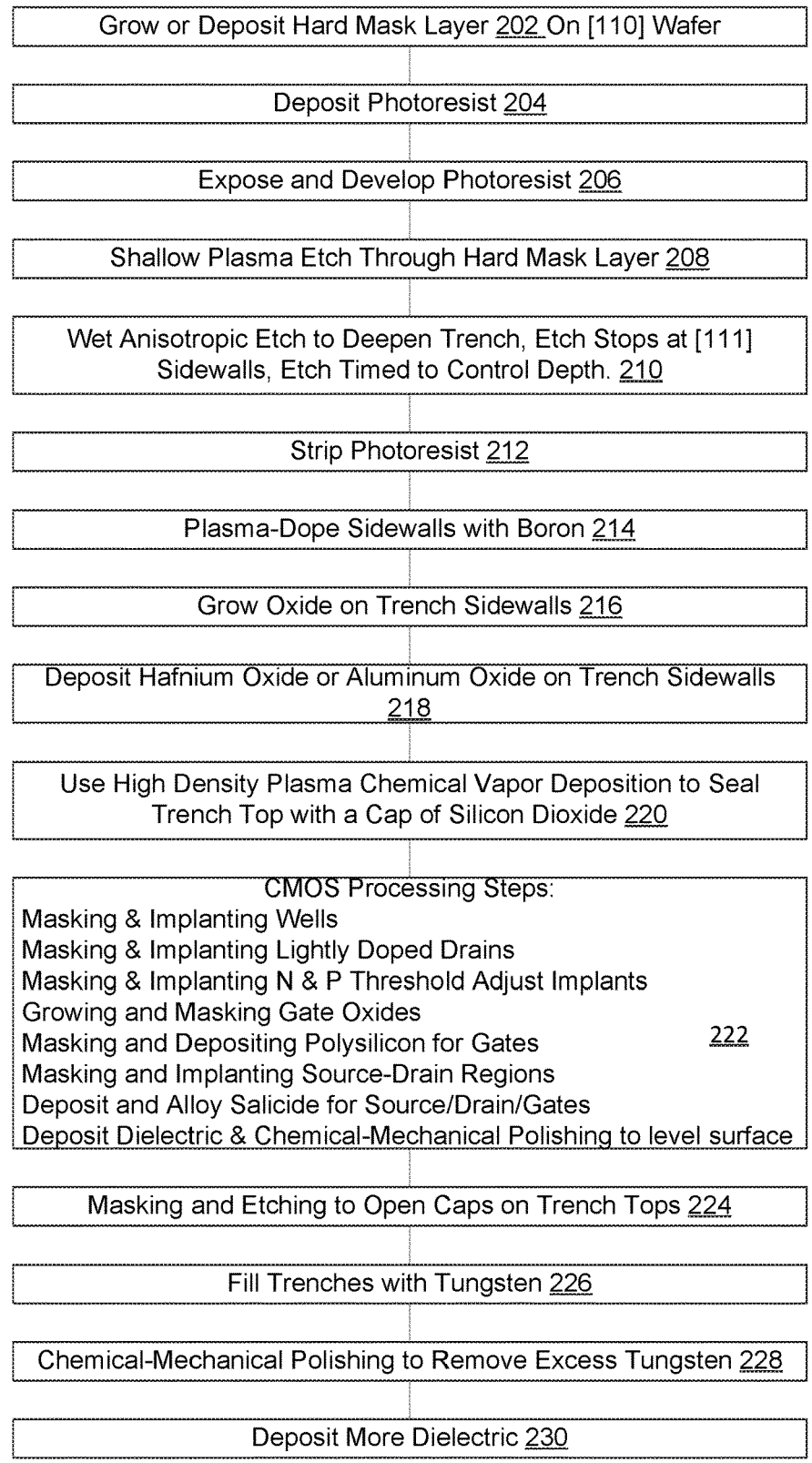
FIG. 2 is a flowchart illustrating some steps of an embodiment of a trench-isolation photodiode process.

Deep-trench isolated silicon photosensor array 100 is built in a silicon [110]-oriented single-crystal substrate wafer 102 (FIG. 1A, 1B) using processing method 200 illustrated in FIG. 2. The method begins by growing or depositing 202 a hard-masking layer 104 (FIG. 1B), such as silicon dioxide or silicon nitride, on the [110] wafer 102. A photoresist layer is then deposited 204 on the hard-masking layer 104. The photoresist is exposed using a photomask, and the photoresist is developed 206 leaving behind photoresist blocks 106 (FIG. 1C) everywhere that trenches should not be cut. Openings 107 between photoresist blocks 106 define locations where the trenches will be formed. Openings 109 are then cut through the hard-masking layer with a brief dry plasma etch 208 leaving islands 108 of the hard-masking layer underneath the photoresist blocks 106. The brief dry plasma etch is configured to avoid etching significantly past the hard-masking layer. The openings 109 between islands 108 of the hard-masking layer are where trenches will be formed.

Figure 1A:
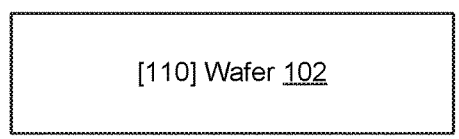
FIGS. 1A, 1B, 1C, 1D, 1E, and 1F are a sequence of cross-sectional schematic diagrams illustrating structures after each of several steps of a trench-isolation photodiode process, in an embodiment.
Figure 1B:
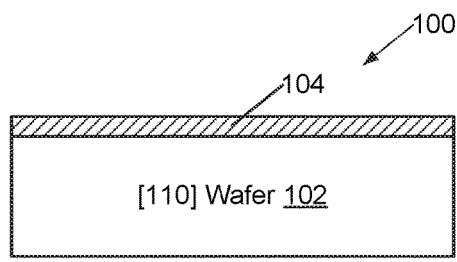
Figure 1C:
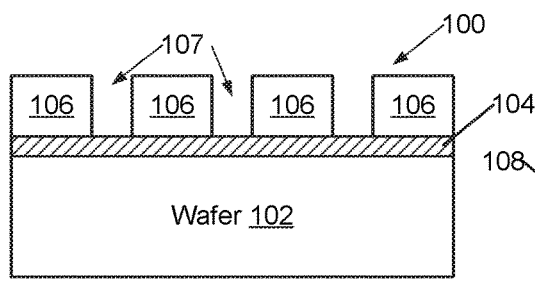
Figure 1D:
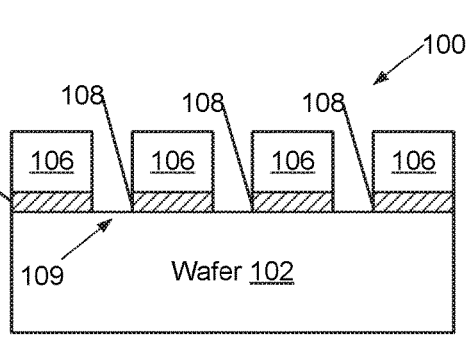
Figure 1E:
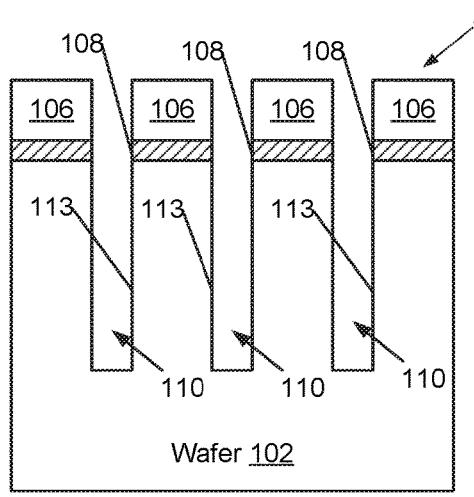
Figure 1F:
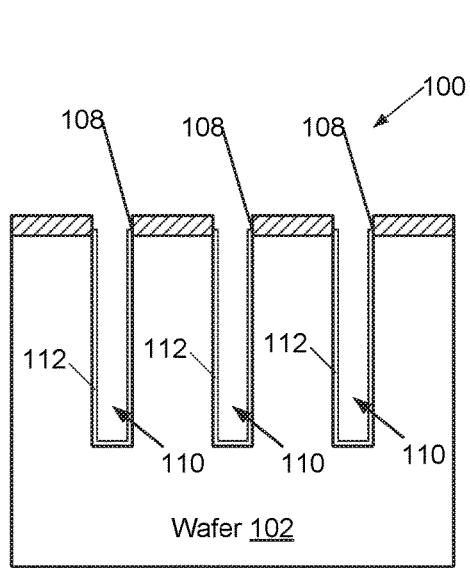

Once the openings 109 are cut in the hard-masking layer, an anisotropic wet-etch 210 is performed. The anisotropic wet etch 210 may employ one of a solution of Potassium Hydroxide (KOH), Tetramethylammonium Hydroxide (TMAH), and Ethylenediamine-Pyrocatechol-water (EDP). The anisotropic wet etch 210 etches downward forming a trench in wafer 102 until etching is stopped on completion of an etching time. The trench is bounded by sidewalls 113 of wafer 102, as shown in FIG. 1E. The anisotropic wet etch fails to attack trench sidewalls 113 because the trench sidewalls 113 are oriented along the [111] crystal orientation. Since photoresist is incompatible with high-temperature processing, any remaining photoresist of photoresist blocks 106 is stripped 212 after the openings 109 are etched 208 through the hard masking layer 104, and before lining (214-218) of the trench sidewalls 113 begins.

In some embodiments, after completion of the anisotropic wet etch 210 and removal of liquid etchant, the wafer is annealed in reducing or inert-gas atmosphere to avoid dangling bonds. In a particular embodiment, the reducing atmosphere comprises hydrogen gas.

Figure 3:
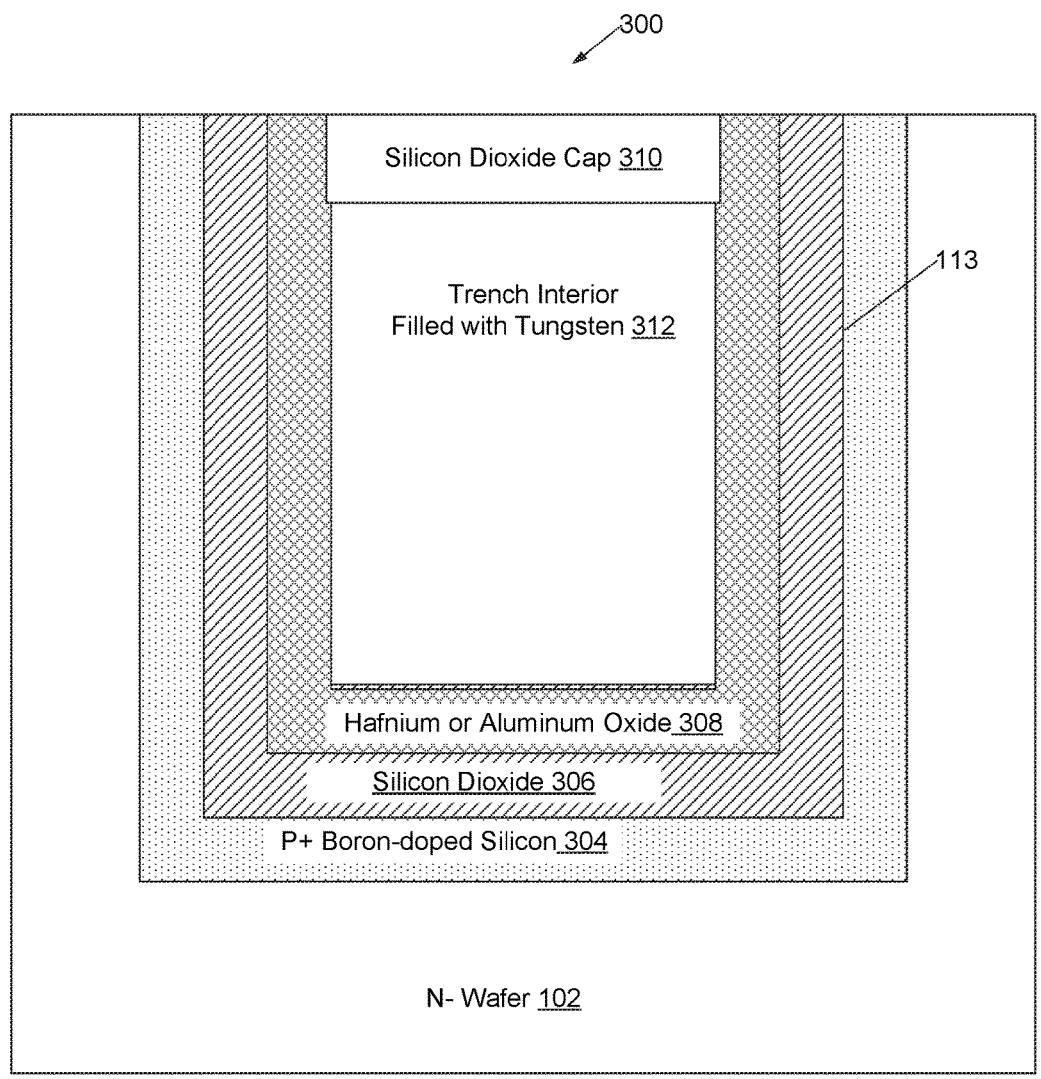
FIG. 3 is a schematic cross-sectional diagram illustrating layers of a lined trench, in an embodiment.

After completion of the anisotropic wet etch 210, the liquid etchant is removed and the trench sidewalls are lined 214-218 with a lining 112 (FIG. 1F) FIG. 3 shows the lining 112 of trench 110, 300, in more detail. Lining of the trench sidewalls 113 is done by plasma-doping 214 a shallow portion 304 of silicon in the sidewalls P-type with Boron, and growing 216 an silicon dioxide layer 306 on the sidewalls 113. A hafnium oxide or, in an alternative embodiment, an aluminum oxide layer 308 is then deposited 218 over the silicon dioxide layer 306. The trench is then capped 220 by using high density plasma chemical vapor deposition to deposit a cap 310 of silicon dioxide.

After the trench has been etched 208, lined 214-218, and capped 220, the process continues with standard CMOS processing steps 222 to form photodiodes and associated transistors of photodiode cells, including masking & implanting wells, masking & implanting lightly doped drains, masking & implanting n & p threshold adjust implants, growing and masking gate oxides, masking and depositing polysilicon for gates, masking and implanting source-drain regions, deposit and alloying metal such as molybdenum to form low-resistance salicide on source and drain regions, and depositing dielectric over the source, drain, and gate regions, and chemical-mechanical polishing to level a top surface of the dielectric.

After forming the photodiodes and associated transistors, processing continues by using a masked etch 224 to selectively open portions of the caps 310 of the trenches, sufficient that tungsten 312 can be deposited 226 by chemical vapor deposition (CVD) into the trenches 300 to fill them. A chemical-mechanical polish 228 is performed to remove excess tungsten and level the surface. In some embodiments some additional dielectric is then deposited 230 and leveled with another chemical-mechanical polish.

Processing then continues with a sequence of masking and etching via or contact holes, depositing masking and etching metal, and depositing dielectric for each layer of metal interconnect used in the photodiode array.

In an alternative embodiment, tungsten 312 is deposited 226 into trenches 300 prior to capping 220 the trenches 300.

The photosensor array may be a frontside-illuminated (FSI) photosensor array, or may be a backside-illuminated photosensor array. In some embodiments, the photosensor array is integrated in the same die as the decoders, drivers, amplifiers, and multiplexors that couple to, drive, sense, and control photosensors of the photosensor array, and in alternative embodiments the photosensor array is bonded to a supporting circuitry die in a bond-per-pixel or bond-per-macrocell photosensor array.

Figure 4:
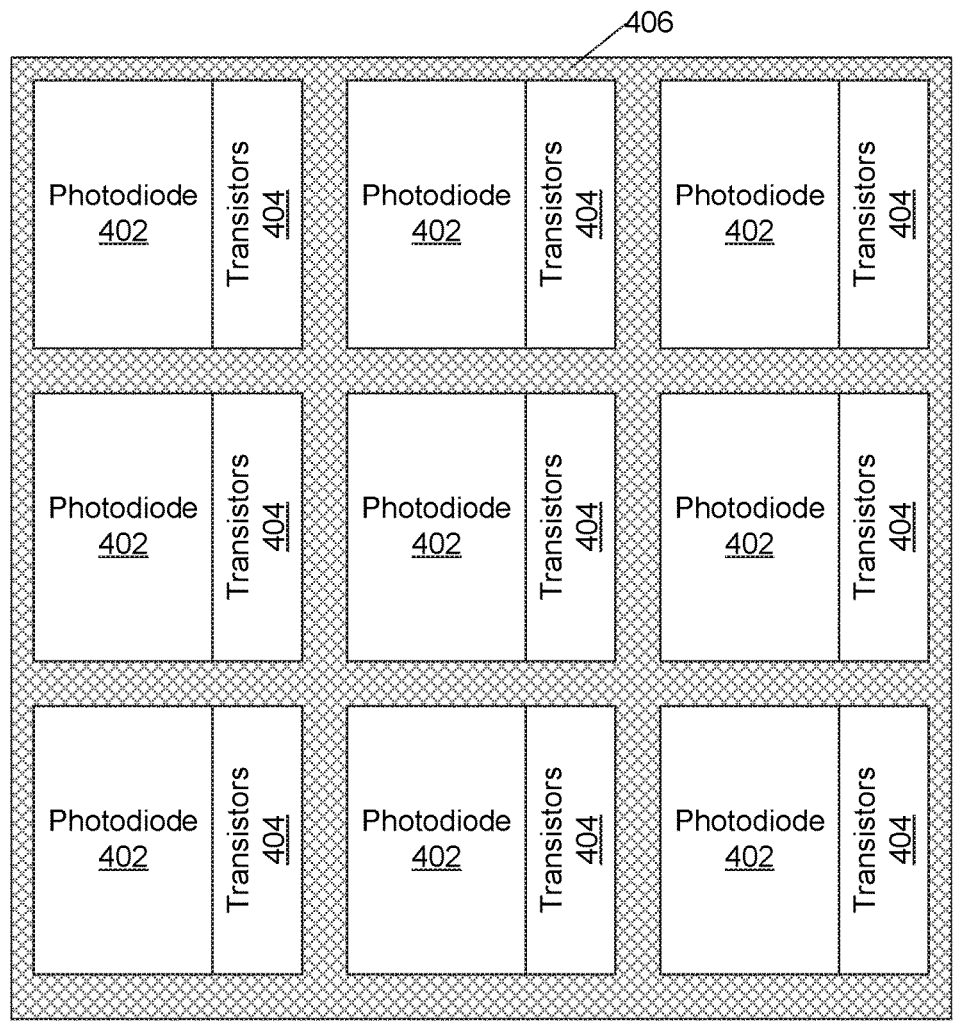
FIG. 4 is a schematic top plan view of a small portion of a photosensor array, showing that photodiodes are isolated from each other by the trenches, in an embodiment.

In an embodiment, as illustrated in FIG. 4, each of photodiodes 402 is each positioned adjacent a respective block having one or more transistors 404, such as selection, precharge or reset, and sensing transistors, as a photosensor cell in an array with trenches 406 separating photosensor cells from each other.

Figure 5:
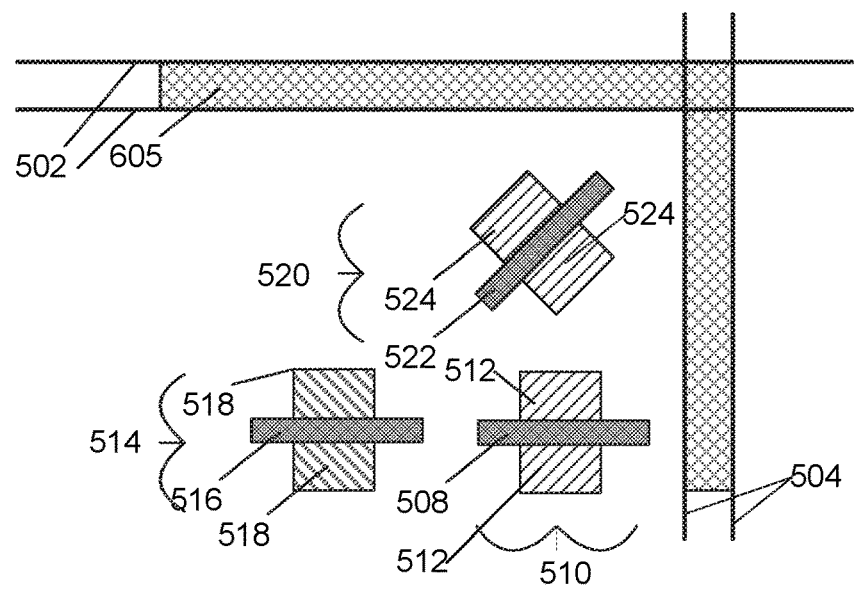
FIG. 5 is a top plan view of a single photosensor array cell showing angles of N and P channel transistors used in photodiode selection circuitry.
Figure 6:
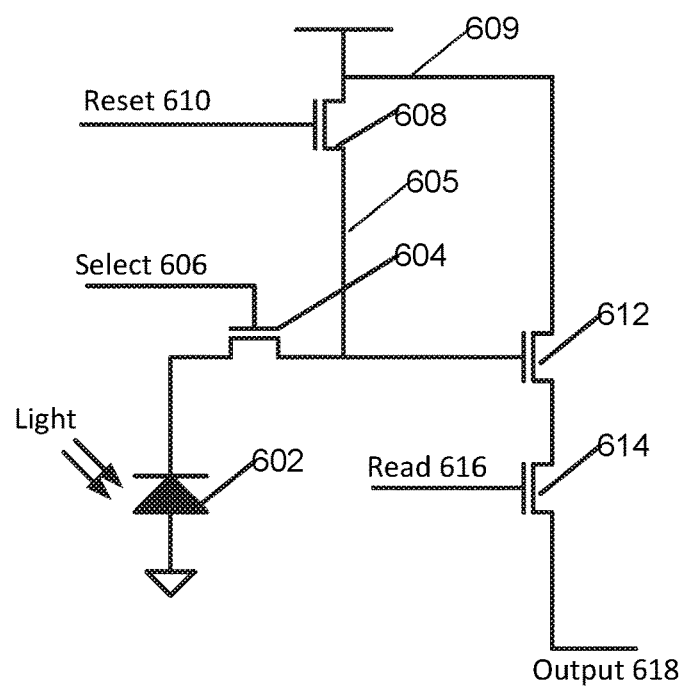
FIG. 6 is a schematic diagram of a pixel cell of a photosensor array incorporating the trench isolation described herein.

Electrons, the carrier species in N-channel field effect transistors (FETs), have significantly lower mobility in traditionally-oriented transistors formed on [110] substrates than on more common [100] substrates. Note that P vs. N diffusion implant, and threshold adjust implant, mask layers are not shown in FIG. 8 for simplicity. Further, silicon electron mobility is anisotropic, being different in different directions through the crystal. With reference to FIGS. 5 and 6, it has been found that, if N-channel field effect transistors 510 are formed with gate 508 polysilicon drawn parallel to the [111] planes 502, 504 (FIG. 5) in the single-crystal silicon that define edges of trenches 506, then these devices have significantly less electron mobility, and thus conduct less current, than do N-channel devices formed on [100] silicon wafers. These N-type transistors 510, referenced herein as perpendicular-N devices, also have a channel between source and drain regions 512 parallel or perpendicular to the [111] planes of the single-crystal substrate.

Conversely, P-type filed effect transistors 514 oriented with gate polysilicon 516 drawn parallel to the [111] planes 502, 504 (FIG. 5) in the single-crystal silicon that define edges of trenches 506, have significantly better hole mobility, and thus conduct more current, than do P-channel devices formed on standard [100] silicon wafers. These P-type transistors 516 have a channel between source and drain regions 518 parallel or perpendicular to the [111] planes of the single-crystal substrate, and are referenced herein as perpendicular-P devices.

It has also been found that It has been found that, if N-channel field effect transistors 520 are formed with gate 522 polysilicon lines drawn at a 45-degree angle to the [111] planes 502, 504 (FIG. 5) in the single-crystal silicon that define edges of trenches 506, then these devices have significantly higher electron mobility, and thus conduct more current, than do N-channel devices formed on [100] silicon wafers. These N-type transistors 520, known as angled-N devices herein, have a channel between source and drain regions 524 approximately oriented 45 degrees, and in embodiments between 40 and 50 degrees, angled from the [111] planes of the single-crystal substrate.

The photodiodes and angled-N transistors described herein may be used in many photodiode array circuits. In a particular embodiment of a photodiode array circuit, as illustrated in FIG. 6, the trench isolated photodiode 602 is coupled through an angled-N selection transistor 604 to a node 605, the selection transistor 604 being controlled by a row selection control line 606. Node 605 also couples through a reset transistor 608 to a power line 609, reset transistor 608 being controlled by a reset control line 610. Node 605 also couples to a gate of a source follower transistor 612 that in a particular embodiment is an angled-N transistor. Power 609 couples to the drain of source-follower transistor 612. A source of source-follower transistor 612 couples through a read transistor 614 to an output 618, read transistor being controlled by a read control line 616.

To take advantage of these differences in mobility in the transistors 404 (FIG. 4) portion of each photosensor of the array, the hard masking layer used to define trench locations is stripped to permit CMOS and photodiode processing. The photodiodes are formed in islands remaining between trenches, together with N-channel transistors formed as angled-N devices, and P-channel devices formed as perpendicular P devices in the transistors portion of each photosensor of the array. In particular embodiments, angled-N devices are used for row and column N-channel selection and reset or precharge transistors in each photosensor cell; an angled-N device being formed having drain electrically coupled to the photodiode and source to a node in transistors portion 404 (FIG. 4), this node may couple through a reset transistor to a precharge voltage source, and to a gate of a buffer, source follower, or amplifier within transistors portion 404. In embodiments having an amplifier or buffer within the photosensor cell transistors portion 404, N-channel buffer and amplifier transistors are also angled-N transistors.

The embodiments herein described have advantage over other photosensor arrays known in the art because the trenches serve as isolation trenches and are deeper than trenches achievable with dry etching alone. These embodiments are thus more resistant to blooming than prior photosensors, because the deeper trenches more effectively block carriers transiting from exposed photosensors into adjacent photosensors s. Further, since the anisotropic etch gives trenches are deeper and narrower than possible with dry etching alone, either the entire array can be fabricated in less area, or more die area can be used for each photodiode thereby increasing sensitivity. Finally, since dark current is reduced over photosensors isolated with trenches formed by dry etching alone, low light imaging is improved.

Combinations of Features

In an embodiment, a method designated A for fabricating a photosensor array integrated circuit includes forming an isolation trench at least in part by depositing a hard mask layer on a [110]-oriented single-crystal silicon substrate wafer, then depositing, exposing, and developing a photoresist on the hard mask layer to define photoresist openings of locations for the trenches. The trenches are cut by dry plasma etching through the photoresist openings to form openings in the hard mask layer of locations for the trenches, and performing an anisotropic wet etch through the openings in the hard mask layer to deepen the trenches. In this embodiment, the isolation trenches may be formed deeper and narrower than isolation trenches cut with dry plasma etching alone.

In a particular embodiment, a method designated AA including the method designated A, further includes lining the trenches by doping a wall of the trenches with boron, and growing an oxide on walls of the trenches. In this embodiment, dark current is reduced by stabilizing hanging bonds on trench walls.

A particular embodiment, a method designated AB including the method designated A or AB, also includes lining the trenches by depositing an oxide, selected from the group consisting of hafnium oxide and aluminum oxide, on the oxide grown on the walls of the trenches. This further stabilizes hanging bonds on trench walls.

A particular embodiment designated AD including the method designated A, AB, or AC further includes filling the trenches with a metal.

In a particular embodiment designated AE including the method designated AD, the metal is tungsten.

In an embodiment, a method designated AF of fabricating a photosensor array includes forming a plurality of isolation trenches by the method designated A, AA, AB, AC, AD, or AE, where the isolation trenches separate a plurality of islands of the photosensor array; and including forming a photodiode and at least one associated transistor in each of a plurality of the islands between the trenches. The trenches thus isolate photosensors, and prevent blooming.

In a particular embodiment designated AG and including the method designated A, AA, AB, AC, AD, AE, or AF, the method further includes lining the trenches by doping a wall of the trenches with boron; and growing an oxide on walls of the trenches.

In a particular embodiment designated AH including the method designated AG, further includes filling the trenches with a metal.

In a particular embodiment designated AI including the method designated AH, the metal with which the trenches are filled is tungsten.

In a particular embodiment designated AJ including the method designated A, AA, AB, AC, AD, AE, AF, AG, AH, or AI, and further including stripping the hard mask layer and forming angled-N channel devices having gates oriented between 40 and 50 degrees to the planes of the single-crystal silicon substrate wafer.

In a particular embodiment designated AK including the method designated AJ, and further including forming perpendicular-P devices having gates oriented perpendicular to the planes of the single-crystal silicon substrate wafer.

In another embodiment designated B, a photosensor array integrated circuit designated B includes multiple photosensor cells formed on a [110]-oriented silicon wafer, the photosensor cells being separated by isolation trenches, where each photosensor cell includes a photodiode and at least one transistor. In this embodiment, each isolation trench has a lining of boron-doped silicon, a layer of silicon dioxide adjacent the boron-doped silicon, and a filler of metal. The [110] wafer orientation allows anisotropic etching to form vertical trenches having [111]-oriented sidewalls, and the lining of these isolation trenches stabilizes dangling bonds to reduce dark current leakage in adjacent photodiodes.

In a particular embodiment designated BA of the array photosensor integrated circuit designated B, the metal filler in the trenches includes tungsten.

In a particular embodiment designated BB of the array photosensor integrated circuit designated B or BA, a second layer of oxide is present between the layer of silicon dioxide and the filler of metal, the second layer of oxide including an oxide selected from the group consisting of hafnium oxide and aluminum oxide.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A method of fabricating a photosensor array comprising:
    forming a plurality of isolation trenches by:
        forming isolation trenches at least in part by depositing a hard mask layer on a [110]-oriented single-crystal silicon substrate wafer,
        depositing, exposing, and developing a photoresist on the hard mask layer to define photoresist openings of locations for the trenches,
        dry plasma etching through the photoresist openings to form openings in the hard mask layer of locations for the trenches, and
        performing an anisotropic wet etch through the openings in the hard mask layer, the anisotropic wet etch configured to stop on [111] planes of the single-crystal silicon substrate wafer at sidewalls of the trenches;
    the isolation trenches separating a plurality of silicon islands of the photosensor array; and forming a photodiode and at least one associated angled-N transistor in each of a plurality of the silicon islands between the trenches, at least a first photodiode and angled-N transistor being separated from a second photodiode and angled-N transistor by a trench.

2. The method of claim 1 further comprising stripping the hard mask layer and forming angled-N channel devices having gates oriented between 40 and 50 degrees to the [111] planes of the single-crystal silicon substrate wafer.

3. The method of claim 2, further comprising lining the trenches by:
doping a wall of the trenches with boron; and
growing an oxide on walls of the trenches.

4. The method of claim 3, further comprising depositing an oxide selected from the group consisting of hafnium oxide and aluminum oxide, on the oxide grown on the walls of the trenches.

5. The method of claim 3, further comprising filling the trenches with a metal.

6. The method of claim 5 further comprising forming perpendicular-P devices having gates oriented perpendicular to the [111] planes of the single-crystal silicon substrate wafer.

7. The method of claim 5, the metal being tungsten.

8. The method of claim 1, further comprising lining the trenches by:
doping a wall of the trenches with boron; and
growing an oxide on walls of the trenches.

9. The method of claim 8 further comprising filling the trenches with a metal.

10. The method of claim 9, the metal being tungsten.

11. The method of claim 1 further comprising forming perpendicular-P devices having gates oriented perpendicular to the [111] planes of the single-crystal silicon substrate wafer.

12. An photosensor array integrated circuit comprising:
a plurality of photosensor cells on a [110]-oriented silicon wafer, the photosensor cells separated by isolation trenches parallel to [111] planes of the silicon wafer, where each photosensor cell comprises a photodiode and at least one N-channel transistor having a gate oriented at a 45-degree angle to the isolation trenches,
the trenches further comprising: a lining of boron-doped silicon, a layer of silicon dioxide adjacent the boron-doped silicon, and a filler of metal.

13. The array photosensor integrated circuit of claim 12, the metal including tungsten.

14. The array photosensor integrated circuit of claim 13, further comprising a second layer of oxide between the layer of silicon dioxide and the filler of metal, the second layer of oxide comprising an oxide selected from the group consisting of hafnium oxide and aluminum oxide.

15. The array photosensor integrated circuit of claim 12 wherein each photosensor cell further comprises a P-channel transistor having gate oriented perpendicular to the trenches.

16. The method of claim 12, further comprising lining the trenches by:
doping a wall of the trenches with boron; and growing an oxide on walls of the trenches.

* * * * *